United States Patent
Kim et al.

(10) Patent No.: US 8,716,854 B2
(45) Date of Patent: May 6, 2014

(54) MULTI-CHIP PACKAGE

(71) Applicant: SK hynix Inc., Icheon-si (KR)

(72) Inventors: Ki Young Kim, Seongnam-si (KR); Myung Gun Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/690,771

(22) Filed: Nov. 30, 2012

(65) Prior Publication Data
US 2014/0015144 A1    Jan. 16, 2014

(30) Foreign Application Priority Data
Jul. 11, 2012 (KR) .......................... 10-2012-0075576

(51) Int. Cl.
*H01L 23/02* (2006.01)

(52) U.S. Cl.
USPC ............ 257/686; 257/777; 257/E25.006; 257/E25.013

(58) Field of Classification Search
CPC ............ H01L 23/49513; H01L 13/4012; H01L 23/4952; H01L 25/047; H01L 25/074; H01L 25/0756; H01L 25/117
USPC .......... 257/686, 777, 779, 781, 787, E25.006, 257/E25.013
See application file for complete search history.

(56) References Cited

U.S. PATENT DOCUMENTS

2011/0215453 A1 *   9/2011   Eng et al. .................... 257/666

* cited by examiner

*Primary Examiner* — Hoai V Pham
(74) *Attorney, Agent, or Firm* — William Park & Associates Patent Ltd.

(57) ABSTRACT

A multi-chip package includes a main substrate; a plurality of first semiconductor chips stacked on an upper surface of the main substrate and having bonding pads which are electrically connected with the main substrate; and a semiconductor package attached to side surfaces of the stacked first semiconductor chips and electrically connected with the main substrate.

20 Claims, 8 Drawing Sheets

MULTI-CHIP PACKAGE

CROSS-REFERENCE TO RELATED APPLICATIONS

The present application claims priority U.S.C. 119(a) to Korean Patent Application Number 10-2012-0075576 filed in the Korean Intellectual Property Office on Jul. 11, 2012, which is incorporated herein by reference in its entirety.

BACKGROUND

1. Field of the Invention

The present invention generally relates to a semiconductor package, and more particularly, to a multi-chip package which has a novel shape capable of accomplishing light weight, thinness, compactness, and miniaturization.

2. Description of the Related Art

In a semiconductor package, in order to increase capacity and extend functionality, a degree of integration is being gradually increased in a wafer state. Further, a semiconductor package in which at least two kinds of semiconductor chips or semiconductor packages are incorporated is being generalized.

In order to extend the functionality of a semiconductor device in a wafer state, substantial equipment investment is needed in a wafer manufacturing process, a lot of costs are incurred, and various problems likely to occur in processing should be solved first. However, incorporating at least two semiconductor chips or at least two semiconductor packages into one package in the course of assembling semiconductor chips into a semiconductor package after manufacturing the semiconductor chips may be realized without requiring prior settlements as described above. Further, when compared to increasing capacity and extending functionality in a wafer state, since the incorporation requires a lesser degree of equipment investment and does not incur a lot of costs, semiconductor device manufacturers have actively conducted search for incorporated type semiconductor packages such as a system-in-package (SIP), a multi-chip package (MCP) and a package-on-package (POP).

Among these incorporated type semiconductor packages, the multi-chip package is manufactured by incorporating at least two packages with different functionalities into one package. In an example of the multi-chip package, a structure is used, in which a plurality of memory chips are stacked on a substrate, a controller chip is stacked on the stacked memory chips, and the memory chips and the substrate and the controller chip and the substrate are electrically connected using wires.

Nevertheless, even in such a multi-chip package, the thickness of the package increases due to the presence of the controller chip stacked on the memory chips, and the wires for connecting the controller chip and the substrate are likely to short-circuit with the wires connected with the memory chips. In order to prevent the wires connected with the controller chip and the wires connected with the memory chips from short-circuiting, the wires connecting the controller chip and the substrate should be formed long. Thus, a design is complicated, the size of the package increases, and a fail such as wire sweeping and wire damage is likely to occur in a molding process.

SUMMARY

An embodiment is directed to a multi-chip package which has a novel shape capable of accomplishing light weight, thinness, compactness and miniaturization.

In an embodiment, a multi-chip package includes: a main substrate; a plurality of first semiconductor chips stacked on an upper surface of the main substrate and having bonding pads which are electrically connected with the main substrate; and a semiconductor package attached to side surfaces of the stacked first semiconductor chips and electrically connected with the main substrate.

The semiconductor package may include: a sub substrate including a mounting part which is attached to the side surfaces of the stacked first semiconductor chips and has first pads, and a connection part which is bent and extends from the mounting part, is placed on the upper surface of the main substrate and has second pads electrically connected with the first pads and the main substrate; and a second semiconductor chip disposed on the other surface of the mounting part facing away from one surface of the mounting part which is attached to the side surfaces of the stacked first semiconductor chips, and having bonding pads electrically connected with the first pads.

The multi-chip package may further include a fixing member formed between the connection part and the main substrate and fixing the connection part and the main substrate to each other.

The sub substrate may include any one of a flexible substrate, a silicon substrate and a lead frame substrate.

The first semiconductor chips and the second semiconductor chip may be different kinds of chips. For example, the first semiconductor chips may be memory chips and the second semiconductor chip may be a controller chip.

The main substrate may further have a groove in which the semiconductor package is fitted. In this case, the semiconductor package may include: a sub substrate including a mounting part which is attached to the side surfaces of the stacked first semiconductor chips and has first pads, and a connection part which extends from the mounting part, is fitted into the groove of the main substrate and has second pads electrically connected with the first pads and the main substrate; and a second semiconductor chip disposed on the other surface of the mounting part facing away from one surface of the mounting part which is attached to the side surfaces of the stacked first semiconductor chips, and having bonding pads electrically connected with the first pads.

The multi-chip package may further include connection members electrically connecting the bonding pads of the first semiconductor chips and the main substrate. Additionally, the respective first semiconductor chips may further have through electrodes which are electrically connected with the bonding pads, and the first semiconductor chips may be stacked on the main substrate such that the through electrodes are connected with one another and are electrically connected with the main substrate.

The first semiconductor chips may be vertically stacked such that the side surfaces of the first semiconductor chips are aligned, and the semiconductor package may be attached to the aligned side surfaces of the first semiconductor chips.

The first semiconductor chips may be stacked in substantially a step-like shape such that the bonding pads are exposed. In this case, each of the first semiconductor chips may have a step surface which faces a main substrate, on the other end thereof facing away from one end on which the bonding pads are disposed, and the semiconductor package may be attached to the step surfaces of the first semiconductor chips and side surfaces of the first semiconductor chips which are connected with the step surfaces.

The multi-chip package may further include a second adhesive member attaching the side surfaces of the first semiconductor chips and the semiconductor package to each other.

Besides, The multi-chip package may further include a molding part sealing the upper surface of the main substrate including the first semiconductor chips and the semiconductor package.

The multi-chip package further includes a molding part sealing the upper surface of the main substrate including the first semiconductor chips and the semiconductor package. The molding part comprises an epoxy molding compound.

The first semiconductor chip includes a circuit block. The multi-chip package further includes a bonding pad formed on a one surface of the semiconductor chip, the bonding pad configured to be used as an electrical contact for the circuit block of the semiconductor chip. The main substrate is a printed circuit board.

DETAILED DESCRIPTION

Hereafter, various embodiments will be described in detail with reference to the accompanying drawings.

It is to be understood herein that the drawings are not necessarily to scale and in some instances proportions may have been exaggerated in order to more clearly depict certain features of the invention.

Figure 1:
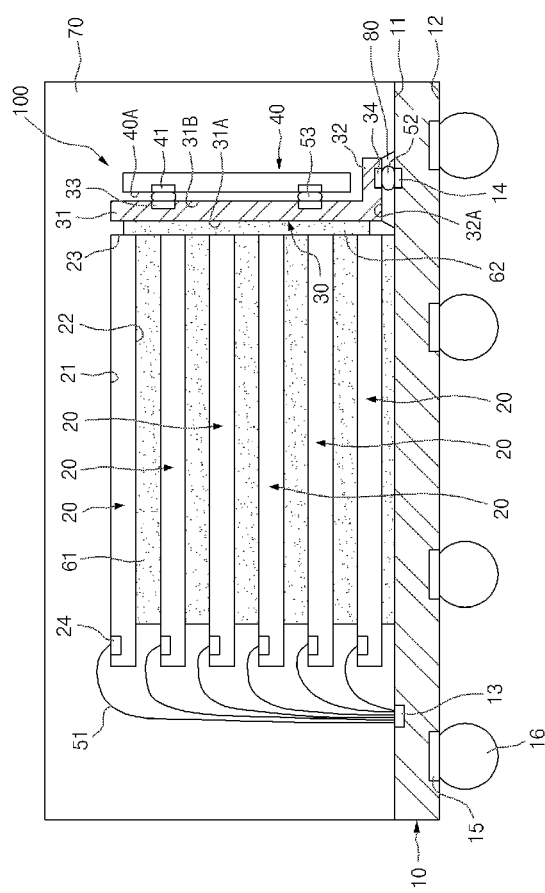
FIG. 1 is a cross-sectional view illustrating a multi-chip package in accordance with an embodiment.

FIG. 1 is a cross-sectional view illustrating a multi-chip package in accordance with an embodiment.

Referring to FIG. 1, a multi-chip package in accordance with an embodiment may include a main substrate 10, a plurality of first semiconductor chips 20, and a semiconductor package 100. Additionally, the multi-chip package further may include first and second connection members 51 and 52, first and second adhesive members 61 and 62, a molding part 70, and a fixing member 80.

The main substrate 10 has an upper surface 11 and a lower surface 12. First connection pads 13 and second connection pads 14 may be formed on the upper surface 11 of the main substrate 10, and ball lands 15 may be formed on the lower surface 12 of the main substrate 10. External connection terminals 16 may be mounted to the ball lands 15. The main substrate 10 may be a printed circuit board (PCB).

Each of the first semiconductor chips 20 possesses one surface 21, the other surface 22 which faces away from the one surface 21 and side surfaces 23 which connect the one surface 21 and the other surface 22, and bonding pads 24.

While not shown, each of the first semiconductor chips 20 may include a circuit block which is constituted by elements such as transistors, capacitors, resistors, etc. for storing, processing and transmitting data. The bonding pads 24 as electrical contacts of the circuit block for connection to an outside may be formed on the one surface 21 of each first semiconductor chip 20.

The first semiconductor chips 20 may be stacked on the upper surface 11 of the main substrate 10 inside the first and second connection pads 13 and 14 by the medium of first adhesive members 61. The first adhesive members 61 may formed between the stacked first semiconductor chips 20, and may formed between the lowermost first semiconductor chip 20 among the stacked first semiconductor chips 20 and the main substrate 10. For example, the first adhesive member 61 may attach the one surface 21 of a first semiconductor chip 20 to the other surface 22 of another first semiconductor chip 20, and the first adhesive member 61 may attach the upper surface 11 of the main substrate 10 to the other surface 22 of the first semiconductor chip 20. Additionally, in an embodiment, the first semiconductor chips 20 may be vertically stacked such that their side surfaces 23 are aligned.

The first connection pads 13 of the main substrate 10 and the bonding pads 24 of the first semiconductor chips 20 may be electrically connected by the medium of the first connection members 51. In an embodiment, the first connection members 51 may be constituted by wires.

The semiconductor package 100 may include a sub-substrate 30 and a second semiconductor chip 40. Additionally, the semiconductor package 100 may further include third connection members 53.

The sub substrate 30 may include a mounting part 31 and a connection part 32.

The mounting part 31 may be attached to the aligned side surfaces 23 of the first semiconductor chips 20 by the medium of a second adhesive member 62. In an embodiment, the mounting part 31 may be attached to the side surfaces 23 of the other ends of the first semiconductor chips 20 facing away from one ends of the first semiconductor chips 20 on which the bonding pads 24 may be disposed.

The connection part 32 may be bent and extending from the mounting part 31 and may be placed on the upper surface 11 of the main substrate 10.

First pads 33 may be formed on the other surface 31B of the mounting part 31 facing away from one surface 31A of the mounting part 31 which may be attached to the side surfaces 23 of the first semiconductor chips 20. Second pads 34 may be formed on one surface 32A of the connection part 32 which faces the main substrate 10, and may be electrically connected with the second connection pads 14 of the main substrate 10. While not shown, circuit traces may be formed in the sub substrate 30, and the first pads 33 and the second pads 34 may be electrically connected with each other by the circuit traces.

While the sub substrate 30 may be constituted by a flexible substrate, it is to be noted that the sub substrate 30 may be constituted by any one of a silicon substrate and a lead frame substrate.

The second connection members 52 may be formed between the second pads 34 of the sub substrate 30 and the second connection pads 14 of the main substrate 10, and may electrically connect the second pads 34 of the sub substrate 30 and the second connection pads 14 of the main substrate 10. Each second connection member 52 may include any one of a bump and a solder ball.

The second semiconductor chip 40 has bonding pads 41 on one surface 40A thereof, and may be mounted to the mounting part 31 in a face-down type such that the one surface 40A formed with the bonding pads 41 faces the other surface 31B of the mounting part 31.

The second semiconductor chip 40 may a different kind of chip from the first semiconductor chips 20. For example, the first semiconductor chips 20 may be memory chips, and the second semiconductor chip 40 may be a controller chip. Unlike this, the second semiconductor chip 40 may be the same kind of chip as the first semiconductor chips 20.

The third connection members 53 may be formed between the first pads 33 of the sub substrate 30 and the bonding pads 41 of the second semiconductor chip 40, and may electrically connect the first pads 33 of the sub substrate 30 and the bonding pads 41 of the second semiconductor chip 40. In an embodiment, each third connection member 53 may include any one of a bump and a solder ball.

Although it was illustrated and described in an embodiment that the second semiconductor chip 40 is disposed in the face-down type on the mounting part 31 of the sub substrate 30 and the bonding pads 41 of the second semiconductor chip 40 and the first pads 33 of the sub substrate 30 may be electrically connected by the medium of bumps or solder balls, it is to be noted that the second semiconductor chip 40 may be disposed in a face-up type on the mounting part 31 of the sub substrate 30 such that the other surface of the second semiconductor chip 40 facing away from the one surface 40A of the second semiconductor chip 40 formed with the bonding pads 41 faces the mounting part 31 of the sub substrate 30 and that the bonding pads 41 of the second semiconductor chip 40 and the first pads 33 of the sub substrate 30 may be electrically connected using wires.

The fixing member 80 may be formed between the one surface 32A of the connection part 32 and the main substrate 10 and may fix the connection part 32 and the main substrate 10 to each other. The molding part 70 may seal the upper surface 11 of the main substrate 10 including the first semiconductor chips 20 and the semiconductor package 100. The molding part 70 may include an epoxy molding compound (EMC).

According to an embodiment, since the electrical connection length between the second semiconductor chip 40 and the main substrate 10 is shortened, advantages may be provided in terms of preventing the occurrence of a fail and accomplishing light weight, thinness, compactness, and miniaturization.

Figure 2:
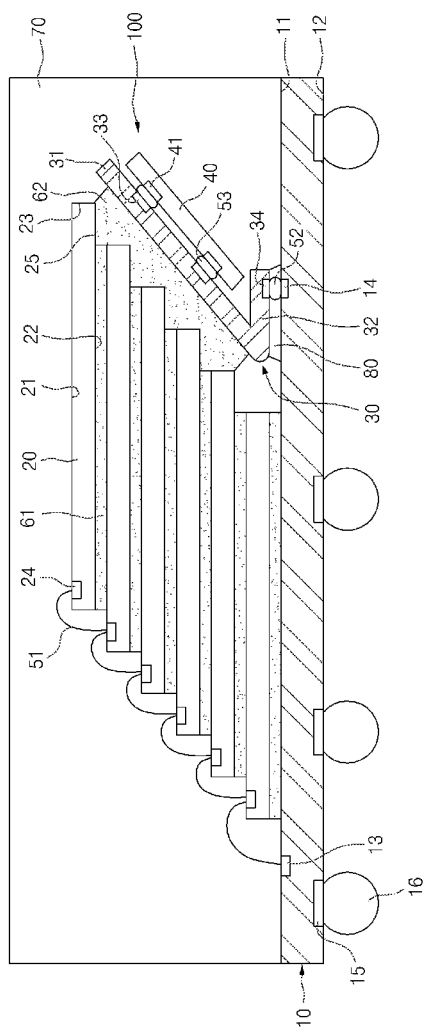
FIG. 2 is a cross-sectional view illustrating a multi-chip package in accordance with an embodiment.

FIG. 2 is a cross-sectional view illustrating a multi-chip package in accordance with an embodiment. The multi-chip package in accordance with an embodiment associated with FIG. 2 may have a construction where the first semiconductor chips 20 may be stacked in a step-like shape. Accordingly, the multi-chip package in accordance with an embodiment associated with FIG. 2 may have substantially the same construction as the multi-chip package in accordance with the embodiments associated with FIG. 1 except the stack structure of the first semiconductor chips 20. Therefore, repeated descriptions for the same component parts will be omitted herein, and the same terms and the same reference numerals will be used to refer to the same component parts.

Referring to FIG. 2, the first semiconductor chips 20 may be stacked in a step-like shape such that bonding pads 24 may be exposed.

Each of the first semiconductor chips 20 may have a step surface 25 which faces a main substrate 10, on the other end thereof facing away from one end on which the bonding pads 24 may be disposed.

A mounting part 31 of a sub substrate 30 of a semiconductor chip 100 may be attached to the step surfaces 25 of the first semiconductor chips 20 and side surfaces 23 of the first semiconductor chips 20 which may be connected with the step surfaces 25, and the semiconductor package 100 may be disposed in the space between the step surfaces 25 of the first semiconductor chips 20 and the main substrate 10

According to an embodiment associated with FIG. 2, since the semiconductor package 100 is disposed in the space between the step surfaces 25 of the first semiconductor chips 20 and the main substrate 10, issues capable of increasing a package size due to the presence of the semiconductor package 100 may be decreased, whereby advantages may be provided in terms of accomplishing light weight, thinness, compactness and miniaturization.

Figure 3:
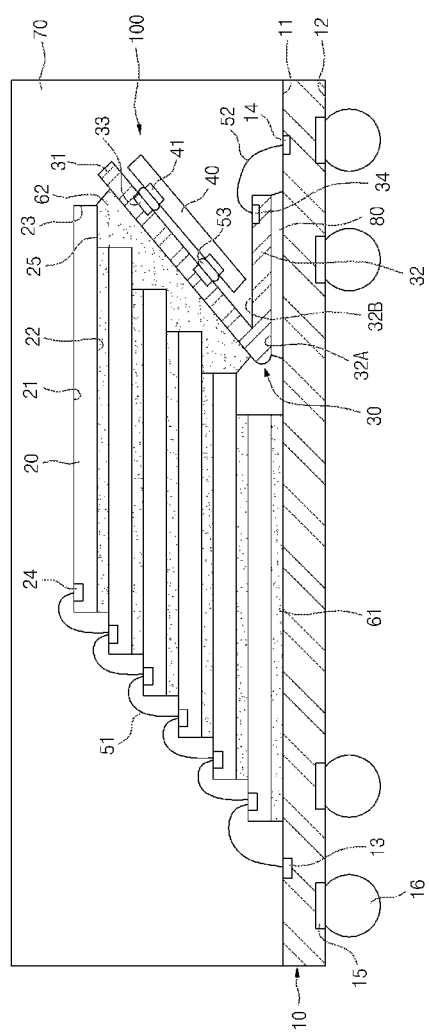
FIG. 3 is a cross-sectional view illustrating a multi-chip package in accordance with an embodiment.

FIG. 3 is a cross-sectional view illustrating a multi-chip package in accordance with an embodiment. The multi-chip package in accordance with an embodiment associated with FIG. 3 may have a construction where second connection members 52 which electrically connect second pads 34 of a sub substrate 30 and the second connection pads 14 of a main substrate 10 may include wires. Accordingly, the multi-chip package in accordance with an embodiment associated with FIG. 3 has substantially the same construction as the multi-chip package in accordance with the various embodiments associated with FIG. 2 except the second connection members 52. Therefore, repeated descriptions for the same component parts will be omitted herein, and the same terms and the same reference numerals will be used to refer to the same component parts.

Referring to FIG. 3, the second pads 34 of the sub substrate 30 may be formed on the other surface 32B of a connection part 32 facing away from one surface 32A which faces the main substrate 10. The second pads 34 of the sub substrate 30 and the second connection pads 14 of the main substrate 10 may be electrically connected using the second connection members 52 constituted by wires.

Figure 4:
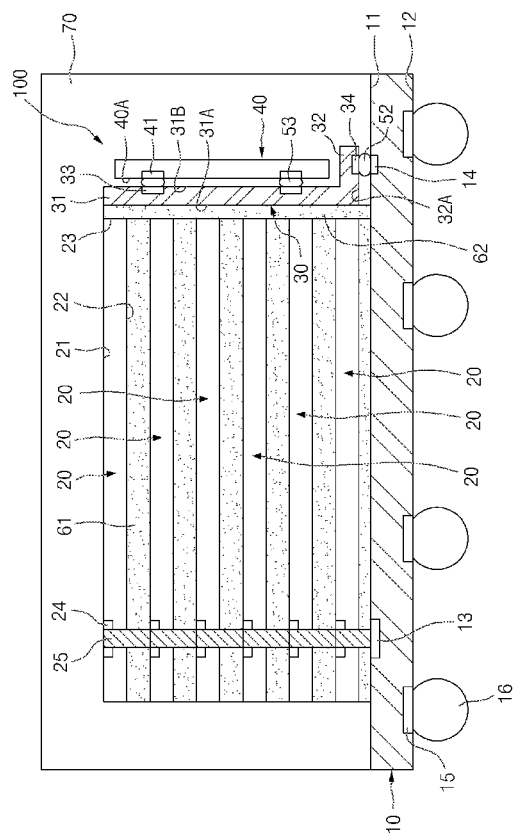
FIG. 4 is a cross-sectional view illustrating a multi-chip package in accordance with an embodiment.

FIG. 4 is a cross-sectional view illustrating a multi-chip package in accordance with an embodiment. The multi-chip package in accordance with an embodiment associated with FIG. 4 may have a construction that first semiconductor chips 20 further include through electrides 25, and the bonding pads 24 of the first semiconductor chips 20 and first connection pads 13 of a main substrate 10 may be electrically connected using the through electrodes 25. Accordingly, the multi-chip package in accordance with an embodiment associated with FIG. 4 has substantially the same construction as the multi-chip package in accordance with the various embodiments associated with FIG. 1 except the through electrodes 25. Therefore, repeated descriptions for the same component parts will be omitted herein, and the same terms and the same reference numerals will be used to refer to the same component parts.

Referring to FIG. 4, each of first semiconductor chips 20 has through electrodes 25 which may be electrically connected with bonding pads 24. The through electrodes 25 of the respective first semiconductor chips 20 pass through the bonding pads 24. The first semiconductor chips 20 may be stacked on a main substrate 10 such that their through electrodes 25 are connected with one another and the through electrodes 25 and first connection pads 13 of the main substrate 10 may be electrically connected.

Figure 5:
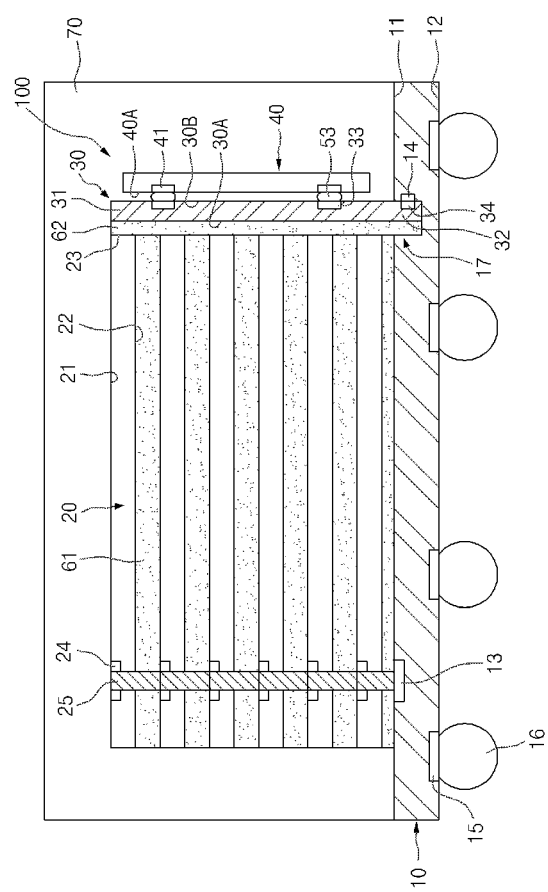
FIG. 5 is a cross-sectional view illustrating a multi-chip package in accordance with an embodiment.

FIG. 5 is a cross-sectional view illustrating a multi-chip package in accordance with an embodiment. The multi-chip package in accordance with an embodiment associated with FIG. 5 has a construction that a main substrate 10 additionally has a groove 17 and a semiconductor package 100 is fitted into the groove 17 of the main substrate 10. Accordingly, the multi-chip package in accordance with an embodiment associated with FIG. 5 may have substantially the same construction as the multi-chip package in accordance with the various embodiments associated with FIG. 4 except the main substrate 10 and the semiconductor package 100. Therefore, repeated descriptions for the same component parts will be omitted herein, and the same terms and the same reference numerals will be used to refer to the same component parts.

Referring to FIG. 5, a main substrate 10 has a groove 17 which is defined on an upper surface 11 of the main substrate 10 and into which a semiconductor package 100 is to be fitted. Second connection pads 14 of the main substrate 10 may be disposed on the inner surface of the main substrate 10 which may be formed due to defining of the groove 17.

A connection part 32 of a sub substrate 30 of the semiconductor package 100 is inserted into the groove 17 of the main substrate 10, and second pads 34 formed on the connection part 32 of the sub substrate 30 may be electrically connected with the second connection pads 14 formed on the inner surface of the main substrate 10.

Figure 6:
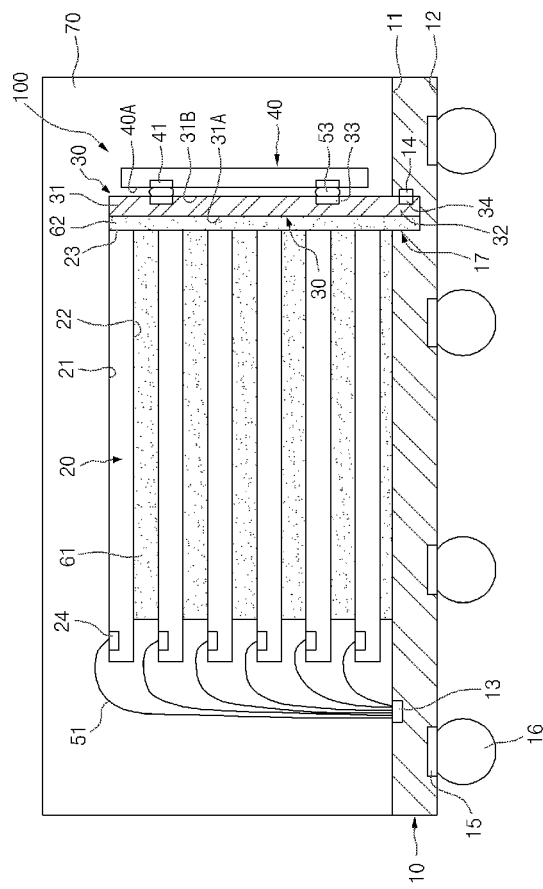
FIG. 6 is a cross-sectional view illustrating a multi-chip package in accordance with an embodiment.

FIG. 6 is a cross-sectional view illustrating a multi-chip package in accordance with an embodiment. The multi-chip package in accordance with an embodiment associated with FIG. 6 may have a construction where a main substrate 10 additionally has a groove 17 into which a semiconductor package 100 is to be fitted and a connection part 32 of a sub substrate 30 of the semiconductor package 100 is fitted into the groove 17 of the main substrate 10. Accordingly, the multi-chip package in accordance with an embodiment associated with FIG. 6 has substantially the same construction as the multi-chip package in accordance with the various embodiments associated with FIG. 1 except the main substrate 10 and the semiconductor package 100. Therefore, repeated descriptions for the same component parts will be omitted herein, and the same terms and the same reference numerals will be used to refer to the same component parts.

Referring to FIG. 6, a main substrate 10 has a groove 17 which is defined on an upper surface 11 of the main substrate 10 and into which a semiconductor package 100 is to be fitted. Second connection pads 14 of the main substrate 10 may be disposed on the inner surface of the main substrate 10 which may be formed due to defining of the groove 17.

A connection part 32 of a sub substrate 30 of the semiconductor package 100 is inserted into the groove 17 of the main substrate 10, and second pads 34 formed on the connection part 32 of the sub substrate 30 may be electrically connected with the second connection pads 14 formed on the inner surface of the main substrate 10.

Although it was illustrated and described in the aforementioned embodiments shown in FIGS. 1 to 6 that only one semiconductor package 100 may be attached to the side surfaces 23 of the first semiconductor chips 20, it is to be noted that the various embodiments are not limited to such and may include a case where at least two semiconductor packages 100 are attached.

The multi-chip packages described above may be applied to various electronic apparatuses.

Figure 7:
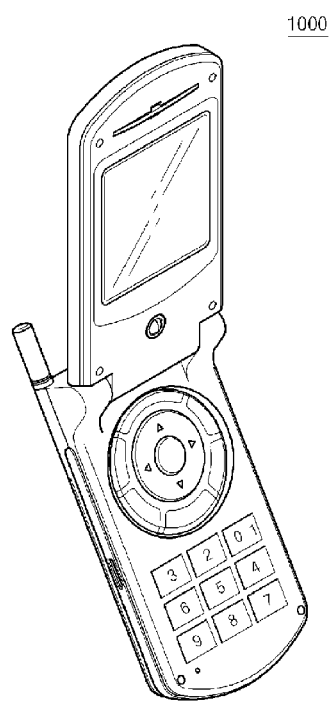
FIG. 7 is a perspective view illustrating an electronic apparatus which has the multi-chip package according to an embodiment.

FIG. 7 is a perspective view illustrating an electronic apparatus which has the multi-chip package according to an embodiment.

Referring to FIG. 7, the multi-chip package according to the various embodiments may be applied to an electronic apparatus 1000 such as a portable phone. Since the multi-chip package according to the embodiments of the present invention provides advantages in that it is possible to prevent the occurrence of a fail and accomplish light weight, thinness, compactness and miniaturization, advantages are provided in improving the reliability and reducing the size of the electronic apparatus 1000. The electronic apparatus 1000 is not limited to the portable phone shown in FIG. 7, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth. Moreover, the multi-chip package according to the embodiments of the present invention may be applied to an SD (secure digital) card, a memory stick, an MMC (multimedia card), an CF (compact flash), an SSC (solid state drive), and so forth, which are used in electronic appliances.

Figure 8:
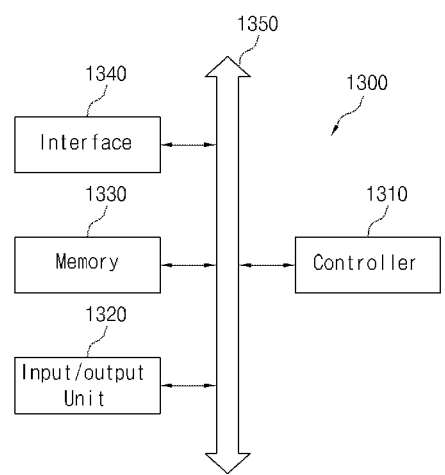
FIG. 8 is a block diagram showing an example of an electronic apparatus which includes the multi-chip package according to an embodiment.

FIG. 8 is a block diagram showing an example of an electronic apparatus which may include the multi-chip package according to the various embodiments.

Referring to FIG. 8, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data move. For example, the controller 1310 may include at least any one of at least one microprocessor, at least one digital signal processor, at least one microcontroller, and logic devices capable of performing the same functions as these components. The controller 1310 and the memory 1330 may include the multi-chip package according to the present invention. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIS), an input/output unit, etc.

Although various embodiments have been described for illustrative purposes, those skilled in the art will appreciate that various modifications, additions and substitutions are possible, without departing from the scope and the spirit of the invention as disclosed in the accompanying claims.

What is claimed is:

1. A multi-chip package comprising:
    a main substrate;
    a plurality of first semiconductor chips stacked on an upper surface of the main substrate and having bonding pads which are electrically connected with the main substrate; and
    a semiconductor package attached to side surfaces of the stacked first semiconductor chips and electrically connected with the main substrate.

2. The multi-chip package according to claim 1, wherein the semiconductor package comprises:
    a sub substrate including a mounting part which is attached to the side surfaces of the stacked first semiconductor chips and has first pads, and a connection part which is bent and extends from the mounting part, is placed on the upper surface of the main substrate and has second pads electrically connected with the first pads and the main substrate; and a second semiconductor chip disposed on the other surface of the mounting part facing away from one surface of the mounting part which is attached to the side surfaces of the stacked first semiconductor chips, and having bonding pads electrically connected with the first pads.

3. The multi-chip package according to claim 2, further comprising:

a fixing member formed between the connection part and the main substrate and fixing the connection part and the main substrate to each other.

4. The multi-chip package according to claim 2, wherein the sub substrate comprises any one of a flexible substrate, a silicon substrate, and a lead frame substrate.

5. The multi-chip package according to claim 2, wherein the first semiconductor chips and the second semiconductor chip are different kinds of chips.

6. The multi-chip package according to claim 5, wherein the first semiconductor chips are memory chips and the second semiconductor chip is a controller chip.

7. The multi-chip package according to claim 1, wherein the main substrate further has a groove in which the semiconductor package is fitted.

8. The multi-chip package according to claim 7, wherein the semiconductor package comprises:

a sub substrate including a mounting part which is attached to the side surfaces of the stacked first semiconductor chips and has first pads, and a connection part which extends from the mounting part, is fitted into the groove of the main substrate and has second pads electrically connected with the first pads and the main substrate; and a second semiconductor chip disposed on the other surface of the mounting part facing away from one surface of the mounting part which is attached to the side surfaces of the stacked first semiconductor chips, and having bonding pads electrically connected with the first pads.

9. The multi-chip package according to claim 8, wherein the second pads are electrically connected with the first pads by circuit traces.

10. The multi-chip package according to claim 8, wherein the sub substrate comprises any one of a flexible substrate, a silicon substrate, and a lead frame substrate.

11. The multi-chip package according to claim 8, wherein the first semiconductor chips and the second semiconductor chip are different kinds of chips.

12. The multi-chip package according to claim 11, wherein the first semiconductor chips are memory chips and the second semiconductor chip is a controller chip.

13. The multi-chip package according to claim 1, further comprising:

first connection members electrically connecting the bonding pads of the first semiconductor chips and the main substrate.

14. The multi-chip package according to claim 1, wherein the first connection members comprise of wires.

15. The multi-chip package according to claim 1, wherein the respective first semiconductor chips further have through electrodes which are electrically connected with the bonding pads, and wherein the first semiconductor chips are stacked on the main substrate such that the through electrodes are connected with one another and are electrically connected with the main substrate.

16. The multi-chip package according to claim 1, wherein the first semiconductor chips are vertically stacked such that the side surfaces of the first semiconductor chips are aligned, and the semiconductor package is attached to the aligned side surfaces of the first semiconductor chips.

17. The multi-chip package according to claim 1, wherein the first semiconductor chips are stacked in substantially a step-like shape such that the bonding pads are exposed.

18. The multi-chip package according to claim 17, wherein each of the first semiconductor chips has a step surface which faces a main substrate, on the other end thereof facing away from one end on which the bonding pads are disposed, and the semiconductor package is attached to the step surfaces of the first semiconductor chips and side surfaces of the first semiconductor chips which are connected with the step surfaces.

19. The multi-chip package according to claim 1, further comprising:

first adhesive members formed between the stacked a first semiconductor chips, and between the main substrate and the lowermost first semiconductor chip among the stacked first semiconductor chip.

20. The multi-chip package according to claim 1, further comprising:

a second adhesive member attaching the side surfaces of the first semiconductor chips and the semiconductor package to each other.

\* \* \* \* \*